US009532125B2

(12) United States Patent
Axelsson et al.

(10) Patent No.: US 9,532,125 B2
(45) Date of Patent: Dec. 27, 2016

(54) NOISE CANCELLATION MICROPHONES WITH SHARED BACK VOLUME

(71) Applicant: Cirrus Logic, Inc., Austin, TX (US)

(72) Inventors: Jens-Peter B. Axelsson, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 93 days.

(21) Appl. No.: 14/298,379

(22) Filed: Jun. 6, 2014

(65) Prior Publication Data
US 2015/0358708 A1 Dec. 10, 2015

(51) Int. Cl.
*H04R 1/08* (2006.01)
*H04R 1/04* (2006.01)
(Continued)

(52) U.S. Cl.
CPC .............. *H04R 1/08* (2013.01); *H04R 1/1083* (2013.01); *H04R 3/002* (2013.01); *H04R 1/04* (2013.01);
(Continued)

(58) Field of Classification Search
CPC ............. H04R 1/08; H04R 3/002; H04R 1/04; H04R 1/083; H04R 3/005; H04R 2201/003; H04R 2410/01; H04R 2410/05; H04R 2499/11
See application file for complete search history.

(56) References Cited

U.S. PATENT DOCUMENTS 5,909,498 A 6/1999 Smith
9,124,220 B2 * 9/2015 Muza et al. ........... H04R 1/406
(Continued)

FOREIGN PATENT DOCUMENTS

JP S62110349 A 5/1987

OTHER PUBLICATIONS

Combined Search and Examination Report under Section 17 & 18(3), Application No. GB1509749.6, dated Sep. 9, 2015, 4 pages.
(Continued)

Primary Examiner — Sonia Gay
(74) Attorney, Agent, or Firm — Jackson Walker L.L.P.

(57) ABSTRACT

An audio device, in at least one embodiment, includes a device package and a plurality of microphones. The device package defines a component cavity and a plurality of vias including a first via and a second via. The vias comprise openings in the device package extending between the component cavity and an exterior. The microphones are located within the component cavity. The microphones are configured to generate electrical signals in accordance with acoustic pressure in the respective vias. A disclosed audio apparatus includes an apparatus housing and a speaker and one or more noise cancellation microphones within the frame. The speaker includes a speaker diaphragm configured to vibrate in accordance with an audio signal. The apparatus housing may define a speaker cavity configured to mechanically support the speaker diaphragm. In at least one embodiment, the audio apparatus includes a multi-microphone device including a first transducer corresponding to a first via and a second transducer corresponding to a second via. A first acoustical conduit may extend from a first end in proximity to the first via to a first exterior location and a second acoustical conduit may extend from a second end in proximity to the second via to a second exterior location.

23 Claims, 9 Drawing Sheets

(51) Int. Cl.
*H04R 3/00* (2006.01)
*H04R 1/10* (2006.01)

(52) U.S. Cl.
CPC ......... *H04R 3/005* (2013.01); *H04R 2201/003* (2013.01); *H04R 2410/01* (2013.01); *H04R 2410/05* (2013.01); *H04R 2499/11* (2013.01)

(56) References Cited

U.S. PATENT DOCUMENTS

| | | | |
|---|---|---|---|
| 2008/0067665 A1* | 3/2008 | Aziz et al. | H01L 23/49827 257/698 |
| 2008/0101625 A1* | 5/2008 | Fazzio et al. | H04R 3/04 381/92 |
| 2009/0003640 A1 | 1/2009 | Burnett | |
| 2009/0080670 A1 | 3/2009 | Solbeck et al. | |
| 2009/0190771 A1* | 7/2009 | Sung | A61F 11/08 381/71.6 |
| 2010/0092020 A1 | 4/2010 | Ryan et al. | |
| 2010/0303273 A1* | 12/2010 | Sawada | H04R 1/406 381/361 |
| 2010/0322432 A1* | 12/2010 | Clemow | G10K 11/178 381/71.1 |
| 2011/0206215 A1* | 8/2011 | Bunk | G06F 1/1694 381/74 |
| 2012/0153771 A1* | 6/2012 | Formosa et al. | B81C 1/0023 310/300 |
| 2012/0243726 A1* | 9/2012 | Hosoo et al. | H04R 1/1016 381/380 |
| 2012/0250897 A1* | 10/2012 | Michel et al. | H04R 19/04 381/111 |
| 2012/0328142 A1 | 12/2012 | Horibe et al. | |
| 2013/0156235 A1 | 6/2013 | Wickstrom | |
| 2014/0211957 A1* | 7/2014 | Bolognia et al. | H04R 3/002 381/74 |
| 2014/0226838 A1 | 8/2014 | Wingate et al. | |
| 2015/0023523 A1* | 1/2015 | Elian et al. | H04R 1/083 381/91 |

OTHER PUBLICATIONS

International Search Report and Written Opinion, International Application No. PCT/US2015/033471, mailed Aug. 31, 2015, 22 pages.
Examination Report under Section 18(3), Application No. GB1509749.6, dated Oct. 25, 2015, 2 pages.

* cited by examiner

NOISE CANCELLATION MICROPHONES WITH SHARED BACK VOLUME

FIELD OF DISCLOSURE

Disclosed subject matter relates in general to audio devices and, more particularly, to audio devices employing noise cancellation microphones or other types of sensing or transducing components.

BACKGROUND

Audio devices including, without limitation, wireless telephones and media players are in widespread use and are often used with headphones or earbuds including a loudspeaker that produces an audible output. The audio performance of such devices with respect to intelligibility can be improved with noise cancelling using one or more noise cancellation microphones to measure ambient noise and then using signal processing to generate an anti-noise signal and combine it with an audio signal provided to the loudspeaker. Noise cancelling may include the use of a noise cancellation microphone referred to herein as an error microphone, for sensing a combination of speaker output and ambient noise near a listener's ear drum. Noise cancelling may also include a second noise cancellation microphone referred to herein as a reference microphone, for sensing undesired ambient noise in order to remove or offset the ambient noise and any other undesired components from the audible output of the speaker.

Locating one or more noise cancellation microphones within a small media player or wireless telephone or within an even smaller headphone, headset, earbud, or other earpiece, is generally challenging due to confined spaces inherent in such devices. It may be even more difficult to locate different types of noise cancellation microphones at the optimal locations. For example, it may be difficult to mount an error microphone at or near the acoustical output of a speaker. More generally, it may be difficult to locate one or more acoustic sensors or transducers within an audio device or a headphone or other earpiece.

SUMMARY

In accordance with subject matter disclosed herein, disadvantages and problems associated with locating noise cancellation microphones including, as examples and without limitation, a reference microphone and an error microphone, within a small housing may be reduced or eliminated. Moreover, although the placement of multiple noise cancellation microphones in a personal audio device or within a headset used with the personal audio device is expressly depicted and described herein, disclosed subject matter encompasses, more generally, the location of sensors or transducers within a small housing.

In accordance with subject matter disclosed herein, a device referred to herein as a multi-microphone device, may include a device package enclosing or containing a plurality of microphones and defining a microphone back volume shared by the plurality of microphones. The microphones may include noise cancellation microphones. For the sake of clarity and brevity, embodiments of the multi-microphone device described herein employ noise cancellation microphones as the components, but other embodiments may include additional or other types of audio components.

In at least one embodiment, the multi-microphone device is, itself, located within a frame or housing of an audio apparatus, which may be embodied in an headphone or earbud that includes a speaker. In some embodiments, the multi-microphone device includes a package that defines a component cavity and a plurality of vias including a first via and a second via. The vias may comprise openings in the device package extending between the component cavity and an exterior of the device package. The plurality of components located within the component cavity may including a first microphone configured to generate a first electrical signal in accordance with acoustic pressure in the first via and a second electrical signal in accordance with acoustic pressure in the second via.

The microphones may employ diaphragms to sense acoustic pressure. A front of a diaphragm of the first microphone may be positioned facing the first via while a front of a diaphragm of the second microphone may be positioned facing the second via. In some embodiments, the back of the microphone diaphragms face the component cavity, which functions as a shared microphone back volume for both microphones. These embodiments may be referred to herein as shared back volume microphones and the multi-microphone device may be referred to herein as a shared back volume device. The use of a shared back volume in the multi-microphone device conserves size and improves low frequency performance compared to multiple microphones in separate enclosures.

Subject matter included herein further discloses an audio apparatus, which may include an apparatus housing and a speaker and one or more noise cancellation microphones within the housing. The speaker may include a speaker diaphragm configured to vibrate in accordance with an audio signal received by the speaker. The vibration of the speaker diaphragm produces sound from a front of the diaphragm. The apparatus housing may define a speaker cavity configured to mechanically support the speaker diaphragm with a front of the speaker diaphragm adjacent to a speaker front volume of the speaker cavity and a speaker substrate adjacent to a speaker back volume of the speaker diaphragm. In at least one embodiment, the audio apparatus includes a multi-microphone device, which may be configured with a first and second vias, a first microphone corresponding to the first via, and a second microphone corresponding to the second via. The audio apparatus may include a first acoustical conduit extending from a first end, in proximity to the first via, to a first exterior location. The audio apparatus may further include a second acoustical conduit which may extend from a second end, in proximity to the second via, to a second exterior location.

Subject matter included herein further discloses a method of fabricating a disclosed multi-microphone device. In at least one embodiment, the method may include obtaining a base portion of a device package, which may include a first via and a second via, and attaching a first noise cancellation microphone and a second noise cancellation microphone to the base portion. The first microphone may be aligned to the first via while the second microphone may be aligned to the second via. A cover portion of the device package may be attached to the base portion to enclose the first and second microphones within a component cavity.

Subject matter included herein further discloses a method of fabricating an audio apparatus. This method may include obtaining a multi-microphone device and an audio apparatus housing. The multi-microphone device may include a device package having multiple vias and multiple microphones. The vias may include first and second vias extending through the device package. The microphones may include a first noise cancellation microphone aligned to the first via and a second noise cancellation microphone aligned to the second via. The audio apparatus housing may define a speaker cavity suitable for enclosing a speaker. The speaker may include a diaphragm that divides the speaker cavity into a speaker front volume and a speaker back volume. An end of the speaker front volume may include or define an audio output port configured for location in close proximity to an ear of a user. The frame may also include or define multiple acoustic conduits. In at least one embodiment, a first acoustic conduit extends from a first position on an interior surface of the audio apparatus housing to a first exterior position while a second acoustic conduit extends from a second position on the interior surface of the audio apparatus housing to a second exterior position. In at least one embodiment, the multi-microphone device is attached to an interior surface of the frame.

In at least one embodiment, noise cancellation microphones are implemented as micro-electro-mechanical (MEMs) microphones. In embodiments that employ MEMs microphones, multiple microphones may share the same substrate, such as a crystalline substrate of silicon or another semiconductor material. In some embodiments, the MEMs microphone may include, more specifically, two or more MEMs sensors that share a semiconductor substrate. In these embodiments, a multi-microphone device housing may enclose, in addition to the plurality of MEMs sensors, signal processing circuitry and one or more other elements or circuits. The additional elements or circuits may include, without limitation, amplifiers and converters including analog-to-digital converters.

It is to be understood that both the foregoing general description and the following detailed description are examples and explanatory and are not restrictive of the scope of the claims set forth in this disclosure.

BRIEF DESCRIPTION OF THE DRAWINGS

A more complete understanding of present embodiments and advantages thereof may be acquired by referring to the following description, taken in conjunction with the accompanying drawings, in which like reference numbers indicate like features, and wherein.

DETAILED DESCRIPTION

Figure 1:
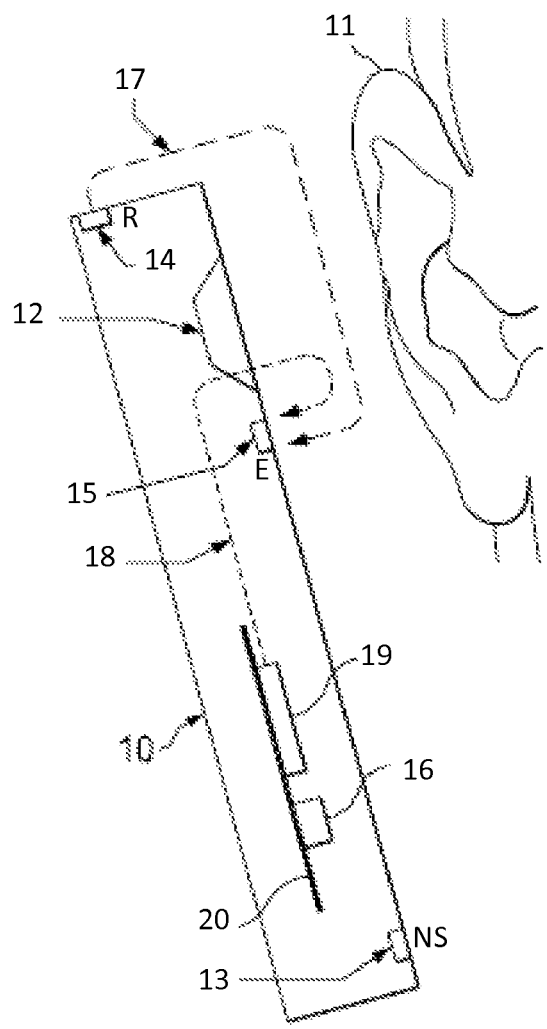
FIG. 1 illustrates elements of a disclosed mobile telephone.

The present disclosure encompasses personal audio devices with one or more speakers including, without limitation headphones, headsets, and earbud devices and more generally, any product in which space is limited and multiple microphones may be useful including, as examples, video cameras, Web-cams, game controllers, toys, and commercial or industrial products including ANC headsets for pilots, and beam forming microphones. The personal audio devices may include adaptive noise cancellation features. Adaptive noise cancellation features may include adaptive noise cancellation circuitry to measure ambient noise and generate an anti-noise signal that is combined with an audio signal provided to the speaker. The anti-noise signal ideally negates or cancels noise that is included in the audio signal provided to the speaker as well as ambient noise at the speaker output, which may be located in closed proximity to the user's ear. A reference microphone may be provided to measure ambient noise and an error microphone may be included for controlling the adaptation of the anti-noise signal to cancel the ambient noise and to correct for the electro-acoustic path from the output of the processing circuit through the speaker. The reference microphone and the error microphone may be provided in a single device attached to an interior of the personal audio device. The microphones may be implemented as two or more MEMs microphones including two or more diaphragms fabricated from a monolithic substrate. In at least one embodiment, each diaphragm or other form of acoustic sensor is aligned to or is otherwise in communication with a corresponding acoustic conduit. The acoustic conduits may extend from the sensors to different points of the audio device apparatus such that the reference microphone detects acoustic pressure at a first position and the error microphone detects pressure at a second position. Following is a description of the various figures.

Although the descriptions and illustrations include general references to microphones and specific references to noise cancellation microphones and MEMs microphones, the disclosed subject encompasses all suitable forms of acoustic transducers and acoustic sensors and all suitable forms of transducers and sensors generally.

In the following description, a reference numeral followed by an Arabic character refers to a specific instance of an element while the same reference numeral, appearing without an Arabic character, refers to the element generically or to a plurality of the elements collectively.

FIG. 1 illustrates an example mobile device 10 located in proximity to a human ear 11. Mobile device 10 may include a device speaker 12 that reproduces distant speech received by mobile device 10, along with other local audio events such as ringtones, stored audio program material, injection of near-end speech (i.e., the speech of the user of mobile device 10) to provide a balanced conversational perception, and other audio that requires reproduction by mobile device 10, such as sources from webpages or other network communications received by mobile device 10 and audio indications such as a low battery indication and other system event notifications.

A device near-speech microphone 13 may be provided to capture near-end speech, which is transmitted from mobile device 10 to the other conversation participant(s). Mobile device 10 may include adaptive noise cancellation circuitry and features that inject an anti-noise signal into device speaker 12 to improve intelligibility of the distant speech and other audio reproduced by device speaker 12. A device reference microphone 14 may be provided for measuring ambient noise, and may be positioned away from the typical position of a user's mouth, so that the near-end speech may be minimized in the signal produced by device reference microphone 14. Another microphone, device error microphone 15, may be provided in order to further improve adaptive noise cancellation operation by providing a measure of the ambient audio combined with the audio reproduced by device speaker 12 close to ear 11, when mobile device 10 is in close proximity to ear 11.

The mobile device 10 illustrated in FIG. 1 includes adaptive noise cancellation circuitry 20. Adaptive noise cancellation circuitry 20 may include an audio integrated circuit (IC) 19 that receives signals from device reference microphone 14, device near-speech microphone 13, and device error microphone 15, and interfaces with other integrated circuits such as a radio-frequency (RF) integrated circuit 16 having a wireless telephone transceiver. In some embodiments of the disclosure, the circuits and techniques disclosed herein may be incorporated in a single integrated circuit that includes control circuits and other functionality for implementing the entirety of the personal audio device, such as an MP3 player-on-a-chip integrated circuit. In these and other embodiments, the circuits and techniques disclosed herein may be implemented partially or fully in software and/or firmware embodied in computer-readable media and executable by a controller or other processing device.

Adaptive noise cancellation circuitry 20 may measure ambient noise at device reference microphone 14 and at device error microphone 15 and adapt an anti-noise signal, to cancel or offset the ambient noise at device error microphone 15, by estimating acoustical characteristics of device reference path 17, which extends from device reference microphone 14 to device error microphone 15. Adaptive noise cancellation circuitry 20 may also cancel or offset audio effects including noise and distortion attributable to acoustical-electrical path 18, which represents the response of the audio output circuits of audio IC 19 and the acoustic/electric transfer function of device speaker 12 including any coupling between device speaker 12 and device error microphone 15 in the particular acoustic environment, which may be affected by the proximity and structure of human ear 11 and other physical objects and human head structures that may be in proximity to mobile device 10, when mobile device 10 is not firmly pressed to human ear 11.

While the illustrated mobile device 10 includes device error microphone 15, a device reference microphone 14, and a device near-speech microphone 13, some aspects of the present invention may be practiced in a system that does not include separate device error and device reference microphones, or a wireless telephone that uses device near-speech microphone 13 to perform the function of the device reference microphone 14. Also, in personal audio devices designed only for audio playback, device near-speech microphone 13 will generally not be included, and the device near-speech signal paths in the circuits described in further detail below may be omitted. In addition, although only one device reference microphone 14 is depicted in FIG. 1, the circuits and techniques herein disclosed may be adapted, without changing the scope of the disclosure, to personal audio devices including a plurality of device reference microphones.

Figure 2:
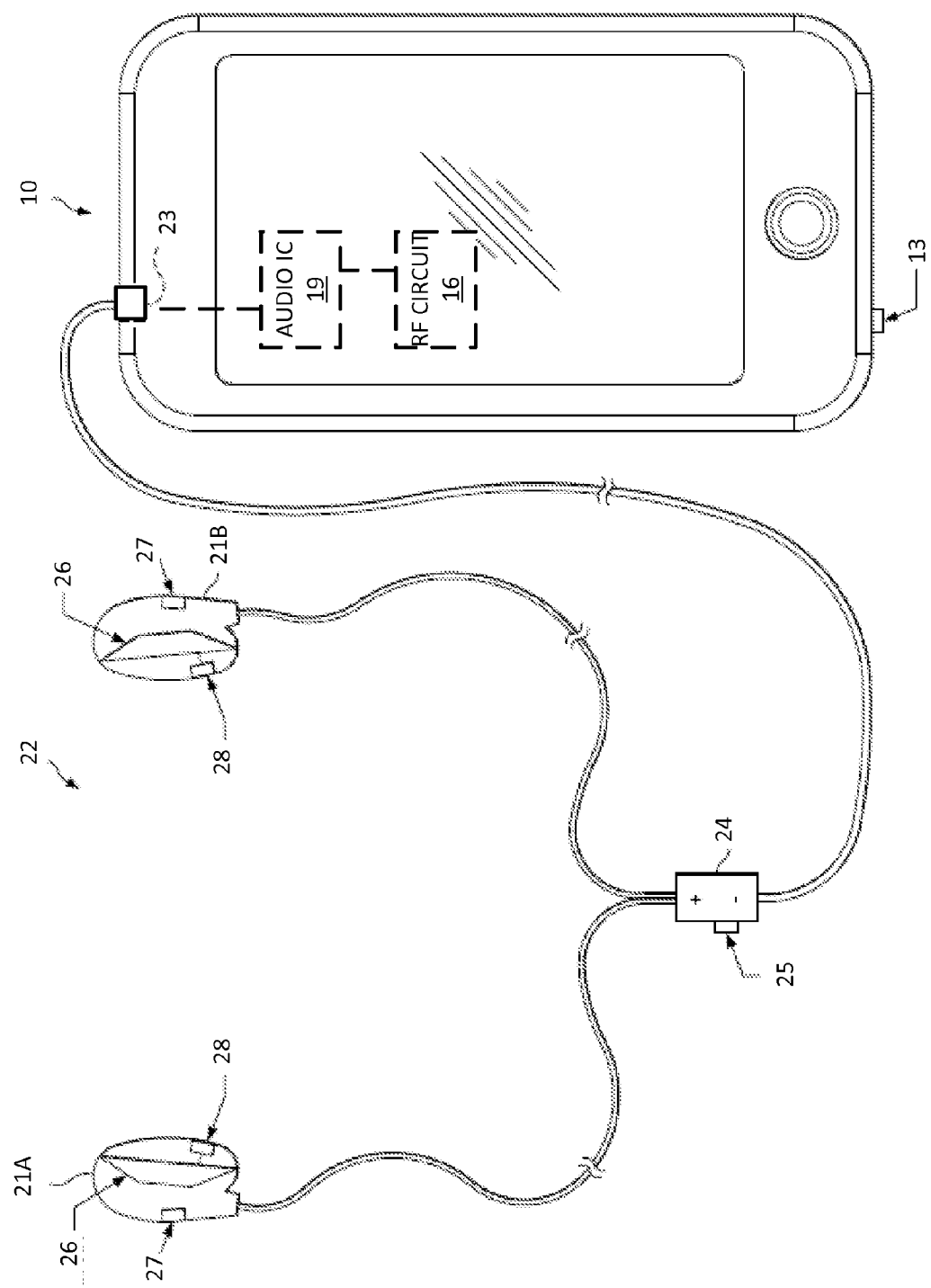
FIG. 2 illustrates a combination of a mobile telephone and a headset.

Referring now to FIG. 2, mobile device 10 is depicted with a headset 22 coupled to it via audio port 23. Audio port 23 may be communicatively coupled to RF integrated circuit 16, audio IC 19, or both, thus permitting communication between components of headset 22 and components of mobile device 10. As shown in FIG. 2, headset 22 may include a combox 24, a left headphone 21A, and a right headphone 21B. As used in this disclosure, the term "headphone" broadly includes any loudspeaker and structure associated therewith that may be mechanically held in place proximate to a listener's ear or ear canal, and includes, without limitation, circumaural, supra-aural, and supra-concha earphones and intra-concha and insert earbuds.

Combox 24 or another portion of headset 22 may have a headset near-speech microphone 25 to capture near-end speech in addition to or in lieu of the near-speech microphone 13 of mobile device 10. In addition, each headphone 21 may include a headset speaker 26 that reproduces distant speech received by mobile device 10, along with other local audio events such as ringtones, stored audio program material, injection of near-end speech (i.e., the speech of the user of mobile device 10) to provide a balanced conversational perception, and other audio that requires reproduction by mobile device 10, such as sources from webpages or other network communications received by mobile device 10 and audio indications such as a low battery indication and other system event notifications.

Each headphone 21 may include a headset reference microphone 27 for measuring ambient noise and a headset error microphone 28 for measuring near-ear acoustics including a noise component and a content component generated by headset speaker 26. In some embodiments, audio IC 19 may receive signals from headset near-speech microphone 25, headset reference microphone 27, and headset error microphone 28 of each headphone 21 and perform adaptive noise cancellation for each headphone 21 as described herein. In other embodiments all or portions of audio IC 19 may be present within headset 22, communicatively coupled to headset reference microphone 27, headset near-speech microphone 25, and headset error microphone 28, and configured to perform adaptive noise cancellation as described herein.

The various microphones referenced in this disclosure, including reference microphones, error microphones, and near-speech microphones, may comprise any device or apparatus configured to convert sound incident at such microphone to an electrical signal that may be processed by a controller, and may include without limitation an electrostatic microphone, a condenser microphone, an electret microphone, an analog micro-electromechanical systems (MEMS) microphone, a digital MEMS microphone, a piezoelectric microphone, a piezo-ceramic microphone, or a dynamic microphone.

Figure 3:
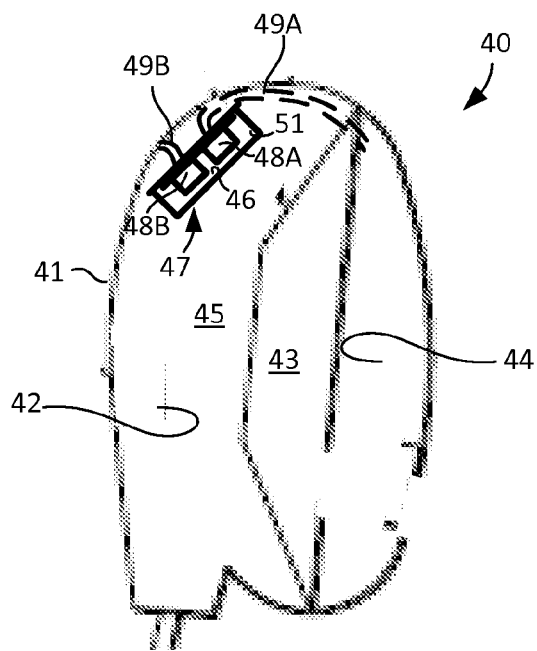
FIG. 3 illustrates an example audio apparatus including a multi-microphone device.

Referring now to FIG. 3, an audio apparatus 40 in accordance with disclosed subject matter is illustrated. The audio apparatus 40 illustrated in FIG. 3 is implemented in an earbud device, but other embodiments may be implemented in headphone devices or in other suitable audio devices. Audio apparatus 40 as illustrated in FIG. 3 includes an apparatus housing 41 defining a speaker cavity 45 and enclosing a speaker 43. As illustrated in FIG. 3, speaker 43 divides speaker cavity 45 into a speaker front volume 44 and a speaker back volume 42.

The audio apparatus 40 depicted in FIG. 3 includes a multi-microphone device 47 including a device package 51 defining a component cavity 46 in which a plurality of components, including a first microphone 48A and a second microphone 48B, are located. Multi-microphone device 47 is illustrated affixed to or otherwise positioned in proximity to housing 41 with first microphone 48A aligned to a first acoustic conduit 49A and second microphone 48B aligned to a second acoustic conduit 49B. Each acoustic conduit 49 provides a tunnel or passage for conveying acoustic pressure present at a first end of the conduit to a corresponding one of the microphones 48 at a second end of the conduit.

In the audio apparatus 40 depicted in FIG. 3, for example, first acoustic conduit 49A conveys sound from a location in front of speaker 43 to the first microphone 48A. First acoustic conduit 49A may, in this configuration, provide an input to an error microphone in an adaptive noise cancellation implementation. The second acoustic conduit 49B is shown configured to convey sound from a location distal to or away from the front of speaker 43 to second microphone 48B of multi-microphone device 47. In this configuration, the second acoustic conduit 49B may convey acoustic pressure from a point that is away from speaker 43 to microphone 48B as a reference signal. Although the microphones 48A and 48B illustrated in FIG. 3 are shown configured to sense acoustic pressure at different positions, first and second microphones 48A and 48B in other embodiments may receive sound from a common position or may receive sound from a single conduit as described in greater detail below with respect to FIGS. 9A, 9B, and 9C. In some embodiments, the component cavity 46 serves as a microphone back volume for both microphones 48 and may be referred to as shared back volume 46.

The location of multi-microphone device 47 within speaker cavity 42 of housing 41 is an example location and other embodiments may locate multi-microphone device 47 at different positions within speaker cavity 42. Moreover, although the illustrated multi-microphone device 47 includes two microphones 48A and 48B, other embodiments may include more microphones. Similarly, although the position of multi-microphone device 47 within speaker back volume 45 may be preferable, other embodiments may position multi-microphone device 47 in or within the speaker front volume 44. For the sake of clarity and simplicity, FIG. 3 is illustrated without wiring or other electrical and mechanical components, but it will be understood that multi-microphone device 47 may include elements such as electrical wiring and components coupled to microphones 48 as well as speaker 43.

Figure 4:
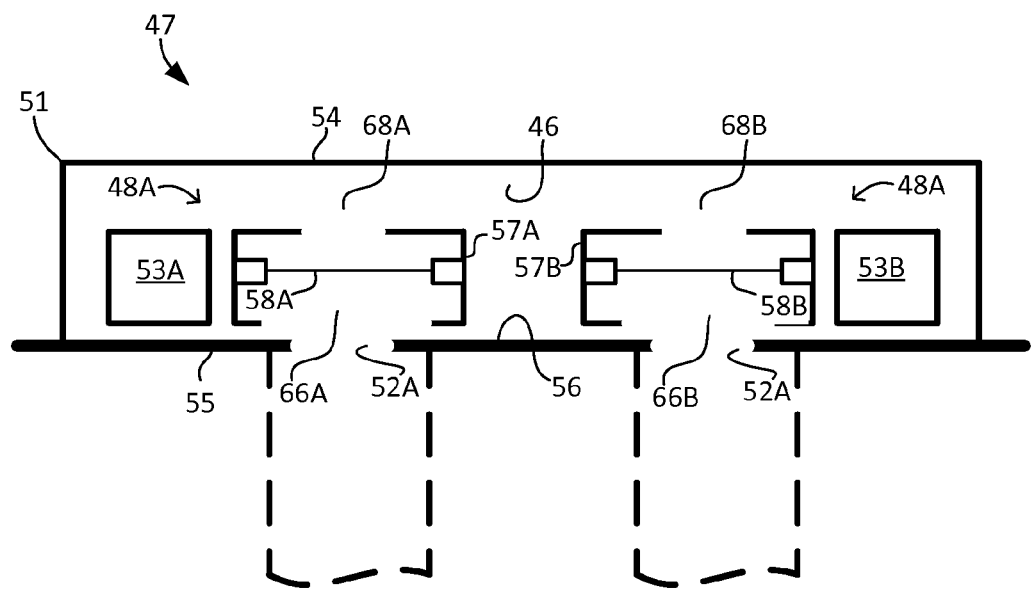
FIG. 4 illustrates a sectional view of an example multi-microphone device.

Referring now to FIG. 4, an example multi-microphone device 47 in accordance with subject matter disclosed herein is illustrated. The multi-microphone device 47 illustrated in FIG. 4 beneficially incorporates two or more microphones 48 in close proximity to one another within a single package 51. The multi-microphone device 47 illustrated in FIG. 4, for example, includes device package 51 defining component cavity 46 enclosing a plurality of microphones 48 including first microphone 48A and second microphone 48B. In at least one embodiment, first microphone 48A and second microphone 48B are micro-electrical-mechanical microphones, also commonly referred to as MEMs microphones, such as the MEMs microphones discussed below in greater detail in connection with FIG. 5. In embodiments of multi-microphone device 47 employing MEMs microphones, first microphone 48A and second microphone 48B may have or share a common substrate. In other embodiments, first microphone 48A and second microphone 48B may have distinct or separate substrates. Embodiments that include shared-substrate microphones may employ a semiconductor substrate such as a silicon substrate fabricated according to known semiconductor fabrication processes.

The device package 51 illustrated in FIG. 4 defines first and second vias 52A and 52B. First microphone 48A is illustrated aligned to first via 52A and second microphone 48B is illustrated aligned to second via 52B. As illustrated in FIG. 4, vias 52A and 52B are tunnels or conduits providing a passage from an interior of device package 51 to an exterior position. The microphones 48A and 48B illustrated in FIG. 4 include acoustic sensors 57A and 57B with acoustic diaphragms 58A and 58B respectively for sensing variations in acoustic pressure. Acoustic diaphragms 58A and 58B are depicted aligned to respective vias 52A and 52B for receiving sound from corresponding acoustic conduits (represented with dashed lines in FIG. 4). In other embodiments, microphones 48 may include another type of acoustic sensor. As illustrated in FIG. 4, each acoustic diaphragm 58 defines a microphone front volume 66 and a microphone back volume 68. In the multi-microphone device 47 illustrated in FIG. 4, the device cavity 46 encompasses back volumes 68A and 68B and serves as a shared back volume for both microphones 48A and 48B.

The microphones 48A and 48B illustrated in FIG. 4 include, in addition to acoustic sensors 57A and 57B, signal processing circuitry 53 including first signal processing circuitry 53A and second signal processing circuitry 53B. Signal processing circuitry 53 may provide, receive, or detect signals from or properties of acoustic sensors 57A and 57B and generate electrical signals in accordance therewith. For example, signal processing circuitry 53 may include, power amplifiers, digital to analog converters, and similar audio processing circuits.

The device package 51 illustrated in FIG. 4 includes a cover 54 attached to a base 55. The base 55 illustrated in FIG. 4 has an interior surface 56 upon which or over which microphones 48 are positioned. In some embodiments, microphones 48 are affixed directly to interior surface 56 of base 55. In other embodiments, microphones 48 may be fixed to a board or other planar structure that is itself affixed to interior surface 56 of base 55. The cover 54 may be comprised of any of various suitable materials including electrically insulating materials, thermally conductive materials, or a combination thereof. In some embodiments, base 55 may also comprise any of various materials, including, as an example, a laminate material suitable for a printed circuit board. In other embodiments, base 55 may be another electrically insulating materials such as a ceramic type material suitable for reducing or preventing moisture penetration.

Figure 5:
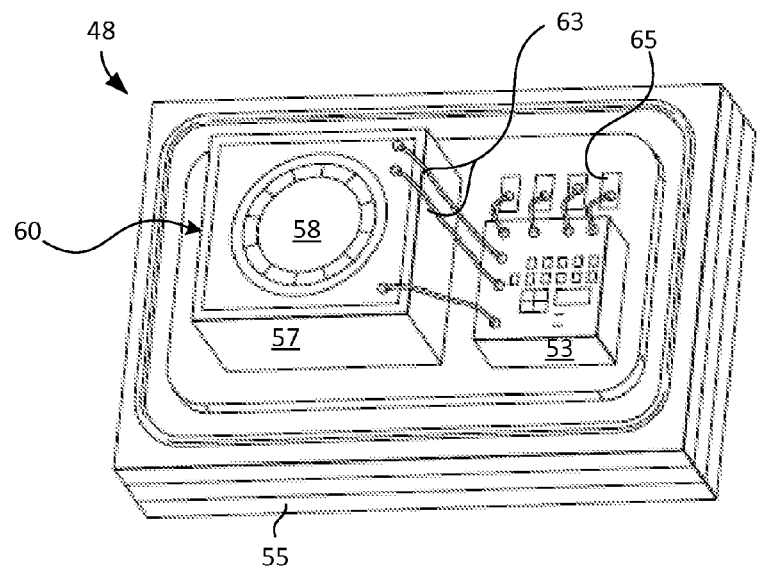
FIG. 5 is a perspective view of an example microphone.

FIG. 5 illustrates microphone 48 implemented as a MEMs microphone 60. The MEMs microphone 60 illustrated in FIG. 5 includes an acoustic sensor 57 with a silicon or semiconductor diaphragm 58 fabricated according to microelectromechanical semiconductor fabrication processes. Acoustic sensor 57 is illustrated in FIG. 5 electrically coupled to signal processing circuitry 53 via wire bonds 63. In other embodiments, other interconnections devices or packages may be used. Signal processing circuitry 53 illustrated in FIG. 5 is electrically connected to output terminals 65 via bond wires 63. Signal processing circuitry 53 may include an power amplifier, a digital to analog converter, or another suitable audio circuit, or a combination thereof. The signal processing circuitry 53 illustrated in FIG. 5 is implemented with a single chip. In other embodiments, signal processing circuitry 53 may be integrated into another chip or implemented with discrete components or may be integrated into another device or formed as part of the substrate of MEMs microphone 60.

Figure 6A:
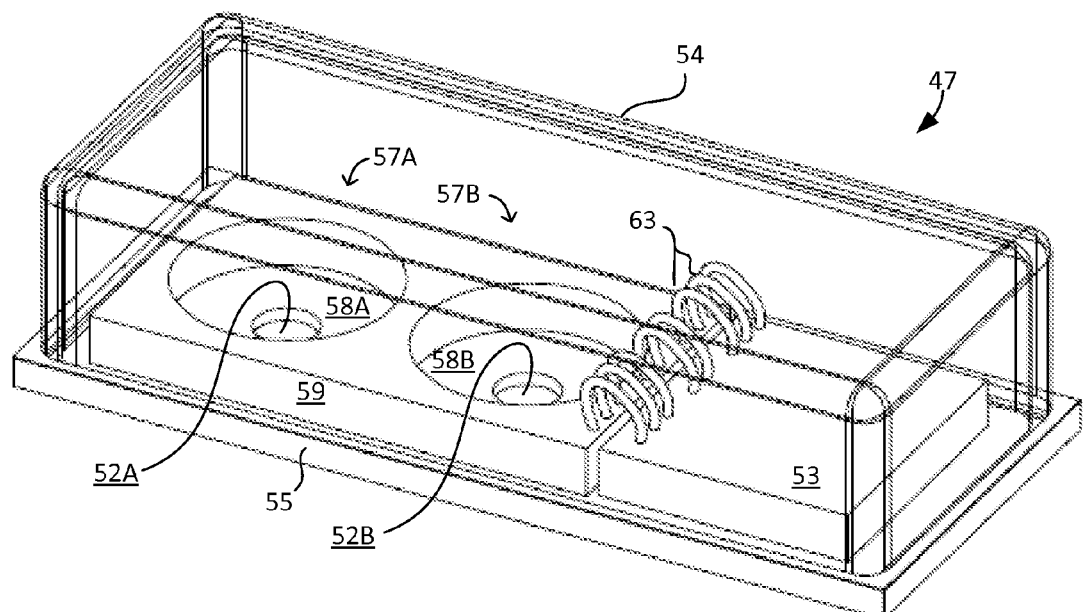
FIG. 6A and FIG. 6B illustrate perspective and plan views of an example multi-microphone device.
Figure 6B:
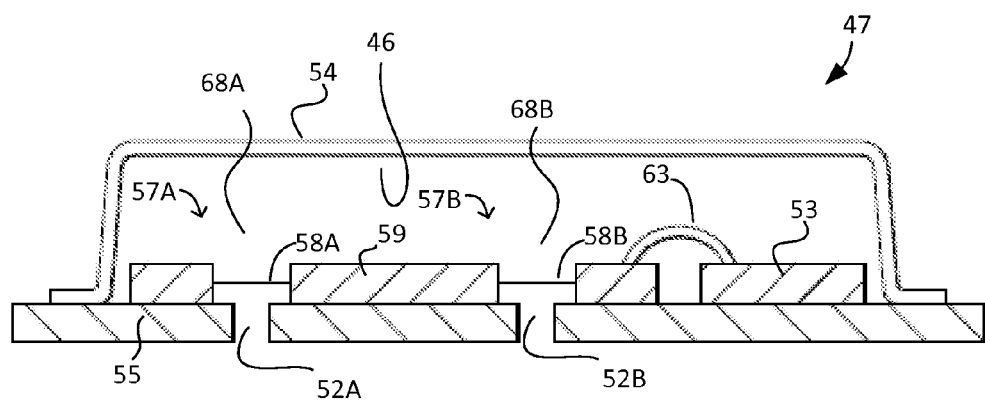

FIG. 6A and FIG. 6B illustrate a perspective view and a sectional view respectively of an embodiment of multi-microphone device 47. In the multi-microphone device 47 illustrated in FIGS. 6A and 7B, first microphone 48A and second microphone 48B include acoustic sensors 57A and 57B fabricated on a common substrate 59. FIG. 6A and FIG. 6B illustrate multi-microphone device 47 with signal processing circuitry 53 connected to the acoustic sensors 57A and 57B via bond wires 63. The acoustic sensors 57A and 57B illustrated in FIG. 6A and FIG. 6B are MEMs sensors that include acoustic diaphragms 58A and 58B.

The multi-microphone device 47 depicted in FIG. 6A includes a cover 54 attached to a base 55 to define a component cavity 46 that serves as a shared back volume 68 for both microphones 48. Acoustic sensors 57A and 57B share a common substrate 59 attached to an upper surface of base 55. As seen most clearly in FIG. 6B, the positioning of acoustic sensors 57A and 57B is such that the acoustic diaphragms 58A and 58B are positioned aligned over the first and second vias 52A and 52B formed in base 55.

The multi-microphone devices 47 illustrated in FIG. 6A and FIG. 6B demonstrates multiple microphones 48 fabricated in a common substrate 59. This embodiment of multi-microphone device 47 may beneficially facilitate manufacturing efficiencies to produce a substrate 59 that is smaller in size than might be possible if acoustic sensor 57A and 57B were implemented in different substrates.

Figure 7:
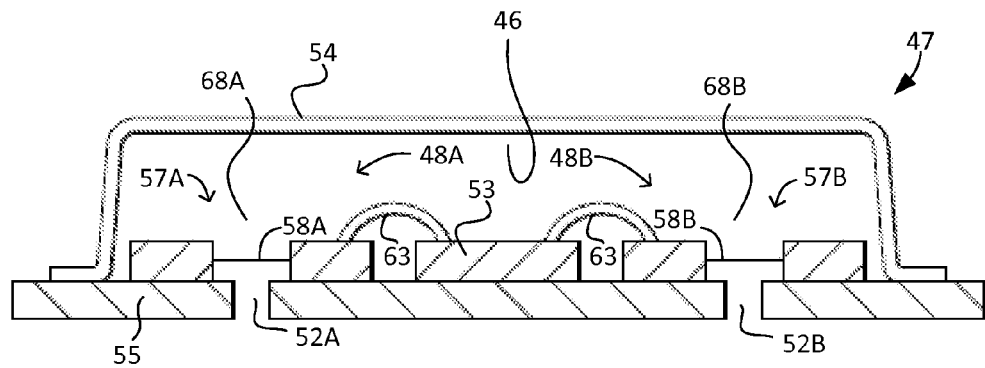
FIG. 7 illustrates a plan view of a second example of a multi-microphone device.

FIG. 7 illustrates multi-microphone device 47 including multiple microphones 48A and 48B in which the first acoustic sensor 57A of first microphone 48A and the second acoustic sensor 57B of second microphone 48B are not formed on a common. While this implementation may not achieve manufacturing efficiencies associated with the embodiments depicted in FIG. 6A and FIG. 6B, the separation of the acoustic sensors 57A and 57B beneficially enables the placement of a single instance of signal processing circuitry 53 between the two acoustic sensors 57A and 57B so that the interconnecting bond wires 63 or other forms of electrical interconnection may be shortened and thereby potentially improve performance from reduced resistance, reduced capacitance, improved symmetry, or other factors.

Similar to the multi-microphone device 47 illustrated in FIGS. 6A and 7B, multi-microphone device 47 of FIG. 7 includes a first via 52A aligned to a first diaphragm 58A and a second via 52B aligned to second diaphragm 58B. However, because signal processing circuitry 53 is positioned between the two acoustic sensors 57 in FIG. 7, the corresponding two vias 52 are separated from one another more than the two vias 52 are separated and FIG. 6B. In some applications, it may be beneficial to select either of the two embodiments depicted in FIG. 6B and FIG. 7 depending upon a desirability of the proximity between the two vias 52. If an application benefits from closely spaced vias, the embodiment illustrated in FIG. 6B may be preferred. Conversely, other applications may prefer or benefit from the greater displacement between vias 52A and 52B illustrated in FIG. 7.

FIG. 6B and FIG. 7 also illustrate microphones 48A and 48B sharing a microphone back volume. The diaphragms 58 of acoustic sensors 57 are configured with a front volume in communication with a via 52. The component cavity 46 serves as the back volumes 68A and 68B of both acoustic sensors 57A and 58B. In this configuration, component cavity 46 functions as a shared back volume 68.

Figure 8:
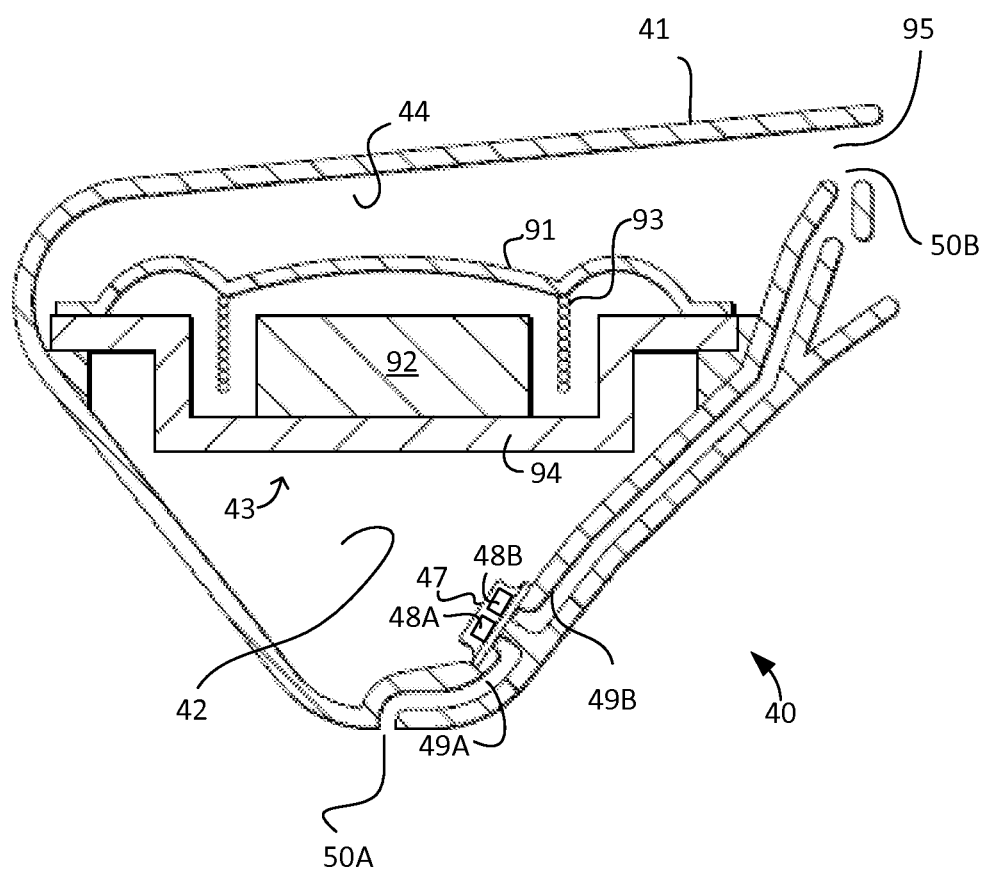
FIG. 8 illustrates a sectional view of an example audio apparatus including a speaker and a multi-microphone device.

FIG. 8 illustrates the audio apparatus 40 in which a multi-microphone device 47 is included. The audio apparatus 40 illustrated in FIG. 8 includes a housing 41 that encloses a speaker cavity in which an loudspeaker 43 is located. Loudspeaker 43 separates the speaker cavity enclosed by housing 41 into a speaker back volume 42 and a speaker front volume 44. The loudspeaker 43 illustrated in FIG. 8 includes a speaker diaphragm 91 attached to a speaker chassis 94 that is itself attached to an interior of housing 41 and separates the speaker cavity into the speaker front volume 44 and a speaker back volume 42. A speaker magnet 92 is affixed to speaker chassis 94 and positioned between or within a speaker coil 93. A speaker diaphragm 91 is affixed at either end to the speaker chassis and is coupled at interior points to speaker coil 93. The housing 41 forms an audio output port 95 at one end of the speaker front volume 44. Audible sound produced by the loudspeaker 43 is directed to the audio output port 95.

The audio apparatus 40 illustrated in FIG. 8 includes a multi-microphone device 47. In FIG. 8, multi-microphone device 47 is attached to an interior surface of housing 41. The multi-microphone device 47 includes a first microphone 48A aligned over a first acoustic conduit 49A and a second microphone 48B is aligned to a second acoustic conduit 49B. The first acoustic conduit 49A extends from the first microphone 48A to a first conduit output 50A. In the audio apparatus 40 illustrated in FIG. 8, the first conduit output 50A is located adjacent to the audio output port 95 at the end of speaker front volume 44. The second acoustic conduit 49B extends from second microphone 48B to a second conduit output 50B. In the audio apparatus 40 illustrated in FIG. 8, the second acoustic conduit 49B extends to second acoustic output positioned behind the speaker back volume 42.

In the configuration illustrated in FIG. 8, two microphones 48A and 48B are positioned in close proximity to one another within a single package and share a back volume space defined by the package, yet each microphone receives a distinct acoustic signal originating from first and second conduit outputs that are separated from one another.

In the acoustic conduit configuration illustrated in FIG. 8, the first acoustic conduit 49A might be employed in conjunction with a first microphone 48A used as the error microphone to produce an error signal while the second acoustic conduit 49B and the second microphone 48B may be employed as the reference signal in an adaptive noise cancellation audio apparatus. Although the audio apparatus 40 illustrated in FIG. 8 has its multi-microphone device 47 positioned in the speaker back volume 42, other embodiments may position multi-microphone device 47 elsewhere within speaker back volume 42 or within speaker front volume 44.

Figure 9A:
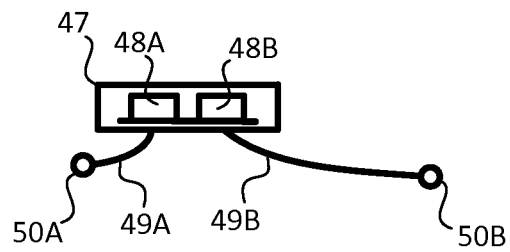
FIG. 9A, FIG. 9B, and FIG. 9C illustrate example acoustic conduit configurations.
Figure 9B:
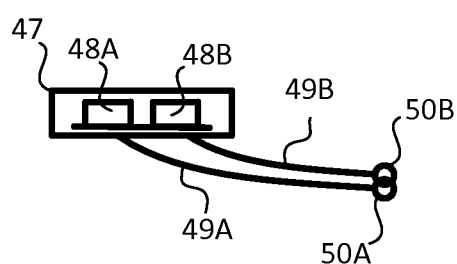
Figure 9C:
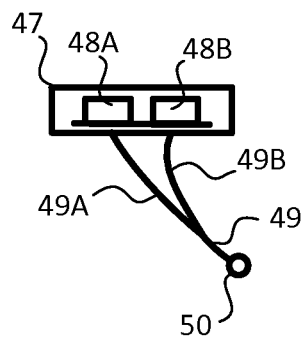

Referring now to FIGS. 9A, 9B, and 9C, non-limiting examples of different acoustic conduit configurations are illustrated. Each of the FIGS. 9A, 9B, and 9C, represent a multi-microphone device 47 including first and second microphones 48A and 48B as described previously. Each of the figures further illustrates an acoustic conduit 49 extending from each of the microphones 48. In FIG. 9A, a first acoustic conduit 49A extends from first microphone 48A to a first point 50A while the second acoustic conduit 49B extends from second microphone 49B to a second point 50 B. In FIG. 9A, the first point 50A and the second point 50B are significantly displaced. This conduit configuration is representative of the conduit configuration illustrated in FIG. 8 and the previous figures wherein microphones 48A and 48B are used to measure signals from different locations. FIG. 9B illustrates a conduit configuration suitable for an application in which it may be beneficial to provide a signal from the same or approximately the same location to two different microphones. This conduit configuration may be suitable for some applications including, without limitation, a beam forming application. FIG. 9C illustrates a conduit configuration in which the two transit inducers receive signals from conduits that are the same or share some portion of the same conduit and originate from a single location in space.

Figure 10:
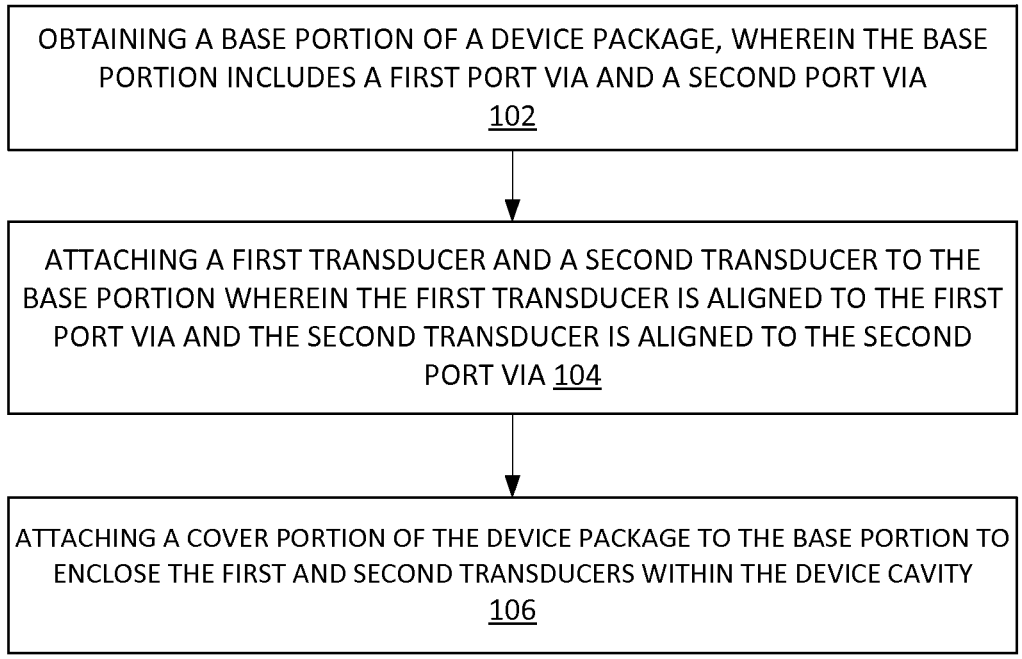
FIG. 10 illustrates an example method of fabricating a multi-microphone device.

FIG. 10 illustrates elements of a method 100 for fabricating a multi-microphone device such as the multi-microphone device 47 described above. The method 100 illustrated in FIG. 10 includes obtaining (block 102) a base portion of a device package. The base portion may include a first via and a second via. A first microphone and a second microphone may be attached (block 104) to the base portion wherein the first microphone is aligned to the first via and the second microphone is aligned to the second via. A cover portion of the device package may then be attached (block 106) to the base portion to enclose the first and second microphones within the component cavity, which may serve as a shared back volume for both of the microphones.

Figure 11:
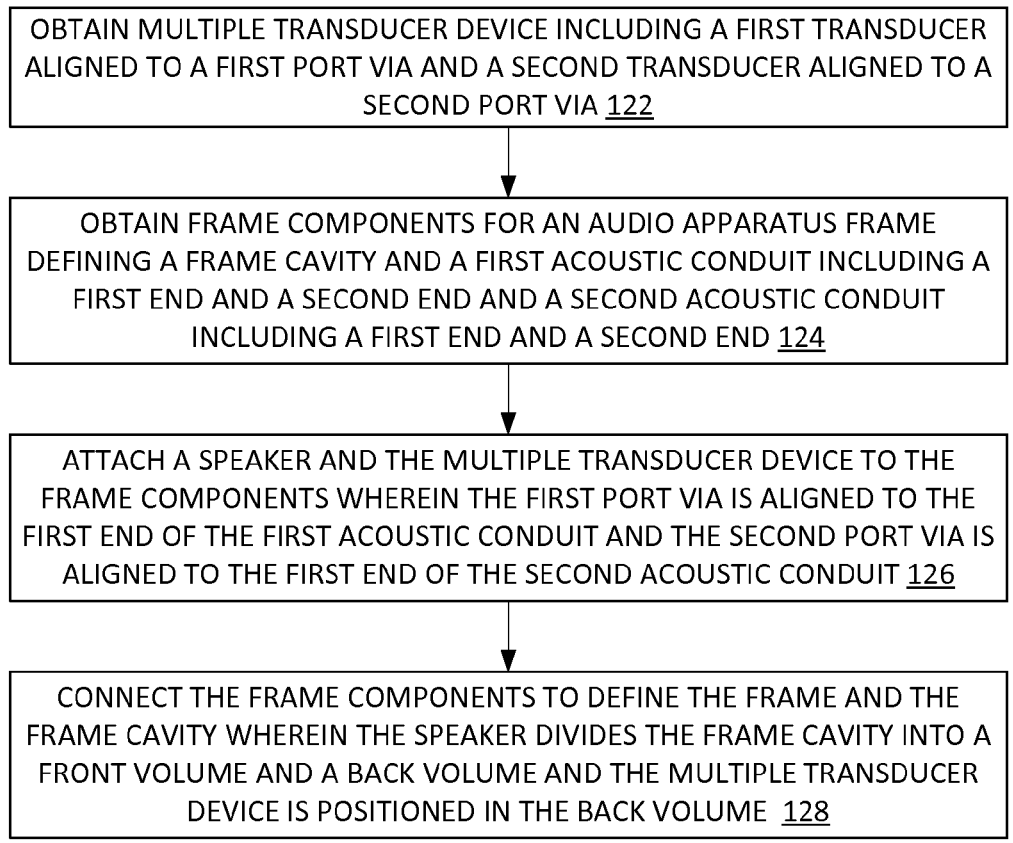
FIG. 11 illustrates an example method of fabricating an audio apparatus.

FIG. 11 illustrates elements of a method 120 for fabricating an audio apparatus such as the audio apparatus 40 described above. The method 120 illustrated in FIG. 11 includes obtaining (block 122) a multi-microphone device that includes a device package that defines a device cavity and includes a first via and a second via. The first and second vias are openings in the device package that may extend through the device package. The multi-microphone device may further include, within the device cavity, a first transducer aligned to the first via and a second transducer aligned to the second via. The device cavity may serve as a device back volume shared by both of the microphones. Method 120 as illustrated in FIG. 11 may further include obtaining (block 124) audio apparatus housing components for an audio apparatus housing that defines a speaker cavity suitable for enclosing a speaker. The speaker, when enclosed, may divide the speaker cavity into a speaker front volume and a speaker back volume. The audio apparatus housing may include an audio output port in communication with the speaker front volume, a first acoustic conduit extending from a first position on an interior surface of the apparatus housing to a first exterior position, and a second acoustic conduit extending from a second position on the interior surface of the apparatus housing to a second exterior position. Method 120 may further include attaching (block 126) the multi-microphone device to the interior surface of the apparatus housing and connecting (block 128) the housing components to define the apparatus frame and the speaker cavity. The multi-microphone device may be positioned in the speaker back volume.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A multi-microphone device, comprising:
    a device package defining a component cavity and a plurality of vias comprising openings in the device package extending between the component cavity and an exterior of the device package, the plurality of vias including a first via and a second via;
    a plurality of microphones within the component cavity, the plurality of microphones including a first microphone configured to generate a first electrical signal in accordance with a first acoustic pressure in the first via and second microphone configured to generate a second electrical signal in accordance with a second acoustic pressure in the second via; and
    a speaker;
    wherein the first microphone and the second microphone share a back volume in common;
    wherein the first acoustic pressure and the second acoustic pressure originate respectively from a first conduit output and a second conduit output, and further wherein the first conduit output and the second conduit output are separated from one another such that the first acoustic pressure is distinct from the second acoustic pressure; and wherein the first acoustic pressure is an acoustic pressure present at an acoustic output of the speaker.

2. The device of claim 1, wherein the first and second microphones comprise first and second micro-electro-mechanical microphones.

3. The device of claim 2, wherein the first and second micro-electro-mechanical microphones share a semiconductor substrate in common.

4. The device of claim 2, further comprising an audio circuit configured to receive and process the electrical signals.

5. The device of claim 1, wherein the package includes:
    a base defining the first via and the second via; and
    a cover, attached to the base;
    wherein the first and second microphones are attached to an interior surface of the base.

6. The device of claim 1, wherein the first and second microphones each include:
    a sensor having an acoustic characteristic indicative of acoustic pressure in proximity to the sensor; and
    a converter coupled to the sensor and configured to generate the electrical signal, wherein the electrical signal is indicative of the acoustic characteristic.

7. The device of claim 6, wherein the sensor includes a diaphragm for sensing the acoustic pressure.

8. The device of claim 7, wherein the diaphragm comprises a semiconductor diaphragm.

9. The device of claim 6, further comprising an audio circuit configured to receive the electrical signal and generate an audio signal in accordance with the electrical signal.

10. The device of claim 9, wherein the audio circuit comprises an analog to digital converter configured to generate a digital audio signal.

11. The device of claim 9, wherein the audio circuit comprises a power amplifier configured to generate an analog audio signal.

12. An audio apparatus, comprising:
a speaker diaphragm configured to vibrate in accordance with an audio input signal received by the speaker, thereby producing sound from a front of the speaker diaphragm;
an apparatus housing defining a speaker cavity configured to mechanically support the speaker diaphragm with a front of the speaker diaphragm adjacent to a speaker front volume of the speaker cavity and a speaker substrate adjacent to a speaker back volume of the speaker cavity; and
a multi-microphone device including:
a first microphone;
a first acoustical conduit extending from a first end in proximity to the first microphone to a first exterior location;
a second microphone; and
a second acoustical conduit, extending from a first end in proximity to the second microphone to a second exterior location;
wherein a microphone back volume of the first microphone and a microphone back volume of the second microphone comprise a shared microphone back volume;
wherein the first exterior location and the second exterior location are separated from one another such that a first acoustic pressure sensed by the first microphone is distinct from a second acoustic pressure sensed by the second microphone; and wherein the first acoustic pressure is an acoustic pressure present at an acoustic output of the speaker.

13. The audio apparatus of claim 12, wherein the multi-microphone device is attached to an interior surface of the apparatus housing within the back volume of the speaker.

14. The audio apparatus of claim 12, wherein the first exterior location is proximal to the speaker front volume and the second exterior location is proximal to the speaker back volume.

15. The audio apparatus of claim 12, wherein the first and second microphones comprise first and second micro electro mechanical microphones.

16. The audio apparatus of claim 12, wherein the first exterior location is proximal to the second exterior location.

17. The audio apparatus of claim 16, wherein a portion of the first acoustic conduit and a portion of the second acoustic conduit comprise a shared conduit.

18. The audio apparatus of claim 12, wherein the first exterior location comprises an audio out location proximal to an audio output port defined by the apparatus housing and wherein the second exterior location comprises a reference location on an exterior surface of the apparatus housing opposing the audio output port.

19. A method of fabricating a multi-microphone device, the method comprising:
obtaining a base portion of a device package, wherein the base portion includes a plurality of vias comprising openings in the device package, the plurality of vias including a first via and a second via;
attaching a first microphone and a second microphone to the base portion wherein the first microphone is aligned to the first via and the second microphone is aligned to the second via such that the first microphone is configured to generate a first electrical signal in accordance with a first acoustic pressure in the first via and the second microphone is configured to generate a second electrical signal in accordance with a second acoustic pressure in the second via;
attaching a cover portion of the device package to the base portion to enclose the first and second microphones within a component cavity such that the openings extend between the component cavity and an exterior of the device package, the component cavity including a microphone back volume shared by the first microphone and the second microphone;
attaching a speaker to the device package; and
arranging the first microphone and the second microphone such that a first acoustic pressure incident on the first microphone and a second acoustic pressure incident on the second microphone originate respectively from a first conduit output and a second conduit output, further wherein the first conduit output and the second conduit output are separated from one another such that the first acoustic pressure is distinct from the second acoustic pressure, and further wherein the first acoustic pressure is an acoustic pressure present at an acoustic output of the speaker.

20. The method of claim 19, wherein attaching the first microphone and the second microphone comprises attaching a microphone structure including a microphone substrate, wherein the first microphone comprises a first portion of the microphone structure and the second microphone comprises a second portion of the microphone structure.

21. The method of claim 20, further comprising fabricating the microphone structure.

22. The method of claim 21, wherein fabricating the microphone structure includes:
providing a semiconductor substrate; and
processing the substrate to define a first semiconductor diaphragm in a first portion of the substrate and a second semiconductor diaphragm in a second portion of the substrate.

23. A method of fabricating an audio apparatus, comprising:
obtaining a multi-microphone device including:
a first microphone;
a second microphone;
a device package enclosing the first microphone and the second microphone and defining a microphone back volume shared by the first microphone and the second microphone;
obtaining audio apparatus housing components for an audio apparatus housing defining a speaker cavity suitable for enclosing a speaker wherein the speaker divides the speaker cavity into a speaker front volume and a speaker back volume, wherein the audio apparatus housing includes:
an audio output port in communication with the speaker front volume;
a first acoustic conduit extending from a first position on an interior surface of the apparatus housing to a first exterior position;
a second acoustic conduit extending from a second position on the interior surface of the apparatus housing to a second exterior position, wherein the first exterior position and the second exterior position are separated from one another such that a first acoustic pressure sensed by the first microphone is distinct from a second acoustic pressure sensed by the second microphone, and further wherein the first acoustic pressure is an acoustic pressure present at an acoustic output of the speaker; and attaching the multi-microphone device to the interior surface of the frame.

* * * * *